(12) United States Patent
Taguwa

(10) Patent No.: US 6,589,873 B2
(45) Date of Patent: *Jul. 8, 2003

(54) PROCESS FOR MANUFACTURING A SEMICONDUCTOR DEVICE

(75) Inventor: Tetsuya Taguwa, Tokyo (JP)

(73) Assignee: NEC Electronics Corporation, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/478,687

(22) Filed: Jan. 6, 2000

(65) Prior Publication Data

US 2002/0081858 A1 Jun. 27, 2002

(30) Foreign Application Priority Data

Jan. 7, 1999 (JP) ............................................. 11-002060

(51) Int. Cl.⁷ ............................................. H01L 21/311
(52) U.S. Cl. .................. 438/694; 438/712; 438/742
(58) Field of Search ................ 438/680–685, 438/780, 712, 694, 720, 721, 742, 692; 257/770, 734, 773

(56) References Cited

U.S. PATENT DOCUMENTS

| 5,177,589 A | * | 1/1993 | Kobayashi et al. | ......... 257/773 |
| 5,508,066 A | * | 4/1996 | Akahori | ..................... 427/571 |
| 5,747,384 A | * | 5/1998 | Miyamoto | ................. 438/695 |
| 5,942,282 A | * | 8/1999 | Tada et al. | ................... 438/680 |
| 6,174,805 B1 | * | 1/2001 | Urabe | ......................... 438/694 |
| 6,177,149 B1 | * | 1/2001 | Tada et al. | ................... 438/627 |

FOREIGN PATENT DOCUMENTS

| JP | 09-205070 | | 8/1997 | |
| JP | 10-298768 | | 11/1998 | |
| JP | 11-16858 | | 1/1999 | |
| JP | 11-186197 | * | 7/1999 | ......... H01L/21/285 |

* cited by examiner

Primary Examiner—Benjamin L. Utech
Assistant Examiner—Duy-Vu Deo
(74) Attorney, Agent, or Firm—Katten Muchin Zavis Rosenman

(57) ABSTRACT

There is disclosed a process for manufacturing a semiconductor device. When a metal film is formed by plasma CVD in a contact hole which penetrates an interlayer insulating film and reaches an electrode of the device, a gas comprising hydrogen and argon in a deposition chamber of a plasma CVD apparatus is introduced. Then a metal halide gas is introduced in the deposition chamber simultaneously with or before plasma generation.

8 Claims, 10 Drawing Sheets

Introducing TiCl$_4$ 15 sec. before plasma ignition

Introducing TiCl₄ 5 sec. before plasma ignition

Introducing TiCl$_4$ 5 sec. after plasma ignition

PROCESS FOR MANUFACTURING A SEMICONDUCTOR DEVICE

BACKGROUND OF THE INVENTION

1. Field of the Invention

This invention relates to a process for manufacturing a semiconductor device. In particular, it relates to a process for forming a contact for electrically connecting a device with a wiring.

2. Description of the Related Art

For electrically connecting an MOSFET device with another device or an external electric terminal, on a semiconductor substrate is formed an MOSFET, on which is formed an interlayer insulating film; then a contact hole is opened in the interlayer insulating film to expose the source, the drain and the gate electrodes of the MOSFET; and the opening is filled with a conductive material to form a contact, on which wirings are then formed.

FIGS. 8 and 9 show an example of the process. FIG. 8 is a cross-section along the channel in the MOSFET structure. FIG. 9 is a cross-section along the direction perpendicular to the channel in FIG. 8.

As shown in FIGS. 8(a) and 9(a), an MOSFET device comprising a gate oxide film 303, a polycide structure of gate electrode 304 consisting of a polysilicon film 305 and a tungsten-silicide film 306, a sidewall 308 on the sidewall of the gate electrode, and a source-drain region 307 is formed on a device region of a p-type silicon substrate 301 which is delimited by a device-separating silicon oxide film 302.

As shown in FIGS. 8(b) and 9(b), a BPSG film 309 is formed as an interlayer insulating film and then contact holes 311 reaching the source-drain region 307 and the gate electrode 304 are formed. As seen in the cross section of FIG. 9(b), the contact hole is formed over an brig-out area rather than just over the channel for the gate electrode.

As shown in FIGS. 8(c) and 9(c), a titanium film 312 is formed on the BPSG film surface including the sidewall of the contact holes, on the source-drain region and the gate electrode each exposed in the contact holes. In the process, silicon reacts with titanium on the surfaces of the source-drain region and the gate electrode to form a titanium silicide film 313, which contributes to decrease contact resistance with the contact plug.

As shown in FIGS. 8(d) and 9(d), a titanium nitride film 314 is formed by thermal CVD on the whole surface, filling at least the contact holes. The titanium nitride film is etched back to form plugs, leaving the film only in the contact holes 311. An aluminum-alloy film is formed and then patterned by etching to form upper wirings 315 shown in FIGS. 8(e) and 9(e). The source-drain region and the gate electrode of the MOSFET are connected to another device or an external terminal via the upper wirings 315.

In the process for manufacturing a semiconductor device, the titanium film shown in FIG. 8(c) or 9(c) is formed by plasma CVD because of the following reasons. For example, spattering cannot form an even film both on the bottom and the sidewall of the contact holes. Furthermore, when $TiCl_4$ and $H_2$ are used as reactants, thermal CVD requires a higher substrate temperature of 1000° C. while plasma CVD requires about 600° C.

In conventional plasma CVD, RF power is applied in a chamber in which Ar and $H_2$ gases have been introduced, to generate plasma. After the plasma almost becomes stable, e.g. after 1 to 5 sec, introduction of $TiCl_4$ gas is initiated to form a titanium film.

The process, however, has a problem that when generating plasma from Ar and $H_2$ charge is accumulated on an interlayer insulating film such as the BPSG film 309 as shown in FIG. 10 and may cause a large potential difference between the gate electrode 304 and the silicon substrate 301, leading to electric breakdown in the gate oxide film 303. Particularly, as a device has been miniaturized, a gate oxide film has become thinner and the antenna ratio of the gate electrode, i.e., the ratio defined by dividing the total area of the gate electrode by the area of the gate electrode over the channel region, has been increased, more frequently causing electric breakdown in the gate oxide film. For example, electric breakdown during plasma CVD is negligible for a gate oxide film 150 Å in thickness while eminent at about 100 Å. Furthermore, as the aspect ratio (i.e., depth/diameter) of the contact hole becomes larger, charge imbalance referred to as a shading effect becomes more eminent as shown in FIG. 10, more frequently causing electric breakdown in the gate oxide film.

SUMMARY OF THE INVENTION

In the light of these problems, an objective of this invention is to provide a process for manufacturing a semiconductor device where even for a high-density and highly-integrated device, a gate oxide film is not damaged during forming a metal film in a contact hole by plasma CVD, and a plasma CVD apparatus used therefor.

This invention provides a process for manufacturing a semiconductor device comprising the step of forming a metal film by plasma CVD in a contact hole which penetrates an interlayer insulating film covering a given device formed on a semiconductor substrate and which reaches an electrode of the device, wherein the metal film is formed in the contact hole by introducing a gas comprising hydrogen and argon in a deposition chamber of a plasma CVD apparatus and then introducing a metal halide gas in the deposition chamber simultaneously with or before plasma generation.

This invention also provides a plasma CVD apparatus for the manufacturing process for a semiconductor device, comprising a synchronization/delay mechanism whereby the metal halide gas is introduced simultaneously with or before turning RF power on for plasma generation.

Figure 1:
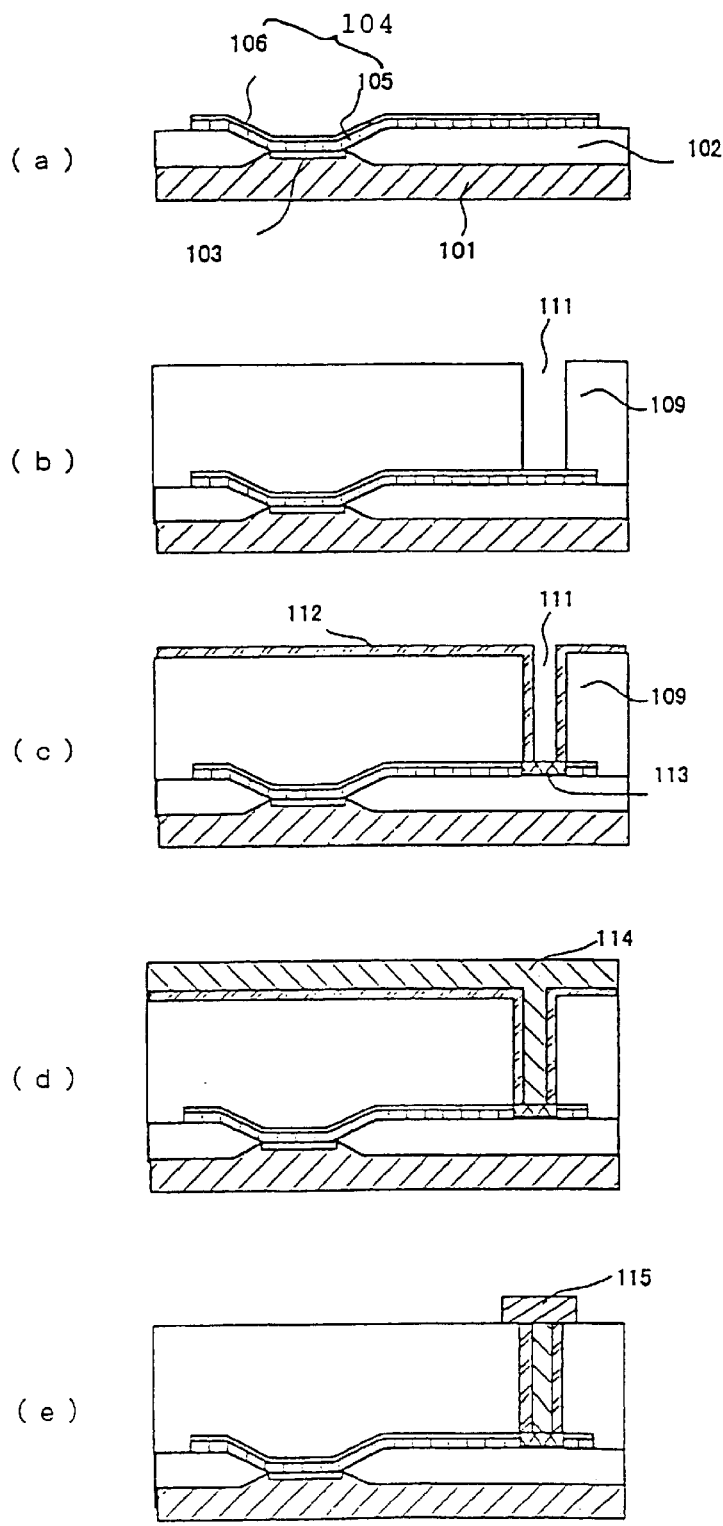
FIG. 1 is a process cross-section showing a process for manufacturing a semiconductor device according to this invention.

In FIGS.;

101: p-Type silicon substrate
102: Device-separating silicon oxide film
103: Gate oxide film
104: Gate electrode
105: Polysilicon film
106: Tungsten silicide film
109: BPSG film
111: Contact hole
112: Titanium film
113: Titanium silicide film
114: Titanium nitride film
115: Upper wirings
301: p-Type silicon substrate
302: Device-separating silicon oxide film
303: Gate oxide film
304: Gate electrode
305: Polysilicon film
306: Tungsten silicide film
307: Source-drain region
308: Sidewall
309: BPSG film
311: Contact hole
312: Titanium film
313: Titanium silicide film
314: Titanium nitride film
315: Upper wirings

DETAILED DESCRIPTION OF THE INVENTION

According to this invention, a metal halide is introduced in a deposition chamber before plasma generation to prevent charge from being accumulated on a device electrode. Therefore, even for a device in which a device electrode is adjacent to a thin insulating film, electric breakdown does not occur in the insulating film and thus device properties are not deteriorated. We assume for the reason of the effect that presence of the metal halide gas in the system may allow the metal film to be formed on the insulating film immediately after plasma generation and thus charge generated due to the plasma may be dispersed or neutralized adequately quickly to prevent charge accumulation.

Furthermore, instability in plasma immediately after turning RF power on did not affect practical deposition performance at all.

In the process of this invention, whether the metal halide gas is introduced simultaneously with or before plasma generation, an acceptable device can be practically manufactured. However, in the light of margins in RF power etc., it is preferably introduced before plasma generation; for example, before at least 1 sec. It is not necessary to introduce the metal halide gas too earlier than plasma generation. Generally, a metal halide gas such as $TiCl_4$ is highly corrosive, and it is, therefore, preferable to avoid exposing a hot substrate or a retainer holding the substrate to the gas for a long time. Thus, in the light of durability of the apparatus, introduction of the metal halide gas may be set to generally up to 15 sec., preferably up to 5 sec. before turning RF power on for plasma ignition.

Although introduction of a metal halide gas and plasma ignition (RF power ON) may be manually controlled by an operator, the plasma CVD apparatus of this invention may be used for automatically turning RF power on after a predetermined period from metal-halide gas introduction (including simultaneous power ON). Such automatic time setting may avoid excessive presence of the metal halide gas in the absence of plasma. A synchronization/delay circuit for the apparatus may be, but not limited to, one where RF power switch is interlocked with a switching valve for introducing the metal halide gas. The CVD apparatus may be suitable for mass production.

A metal film deposited according to this invention is preferably made of a high melting point metal, preferably titanium, tungsten and tantalum. Metal halide gases which may be used include halides of the above metals, preferably chlorides and iodides. $TiCl_4$ and $TiI_4$ are preferable for depositing a titanium metal film.

This invention may be suitably applied a device comprising a thin insulating film in contact with an electrode such as an MOSFET. In particular, this invention may be effectively applied in the step of forming a metal film in a contact hole reaching a gate electrode. This invention is significantly effective when the thickness of the gate insulating film is less than 150 Å, preferably equal to 120 Å or less, more preferably equal to 100 Å or less. The antenna ratio of the gate electrode is preferably equal to 100 or larger.

This invention is particularly effective when the aspect ratio of the contact hole is equal to 6 or larger.

An embodiment of this invention will be specifically described with reference to FIG. 1 showing a cross section along a direction perpendicular to the channel. In the following description, a titanium film is formed with $TiCl_4$ as a metal halide gas, but of course this invention is not limited to the particular gas.

Figure 8:
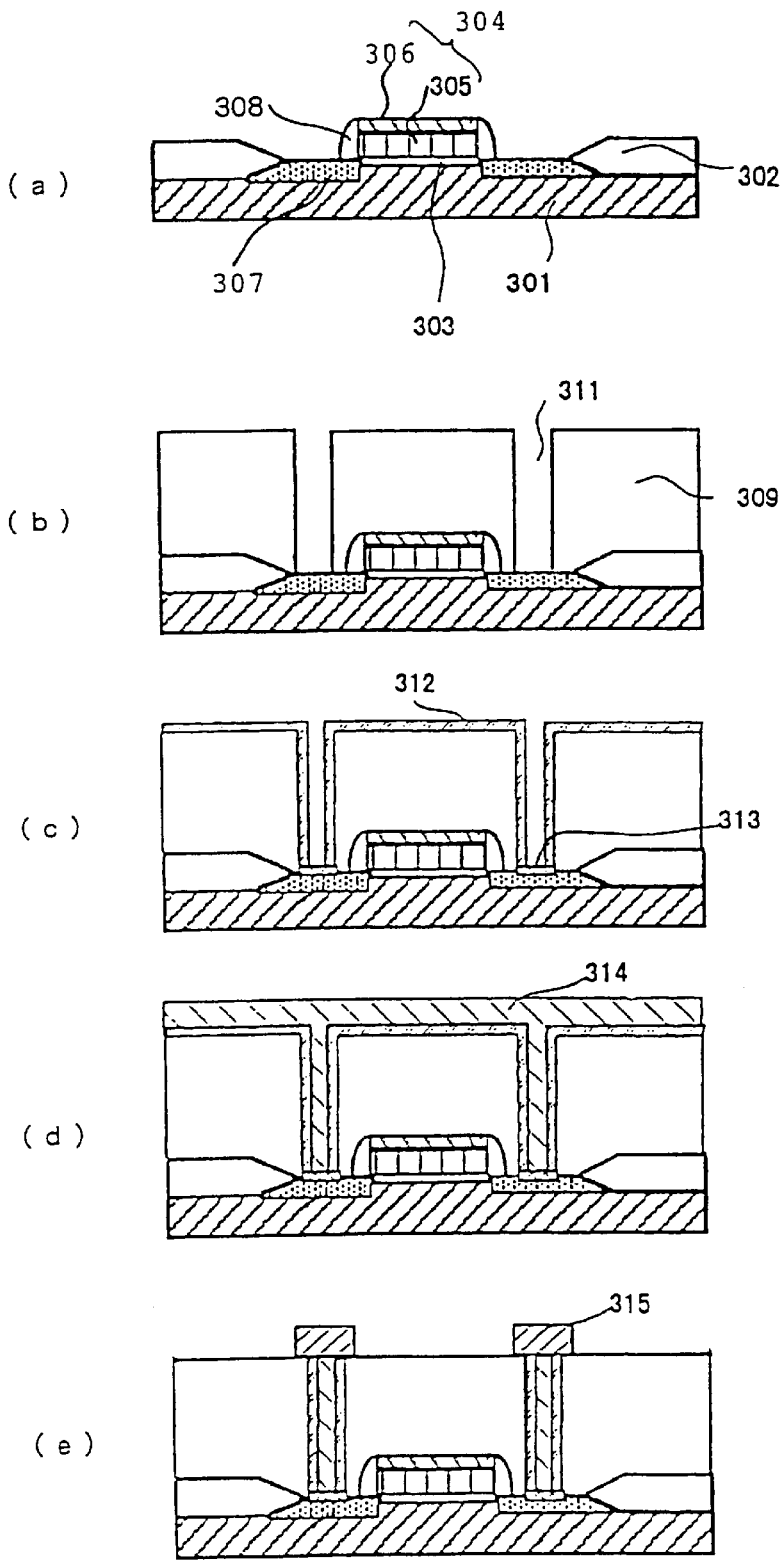
FIG. 8 is a process cross-section showing a process for manufacturing a semiconductor device according to the prior art.
Figure 9:
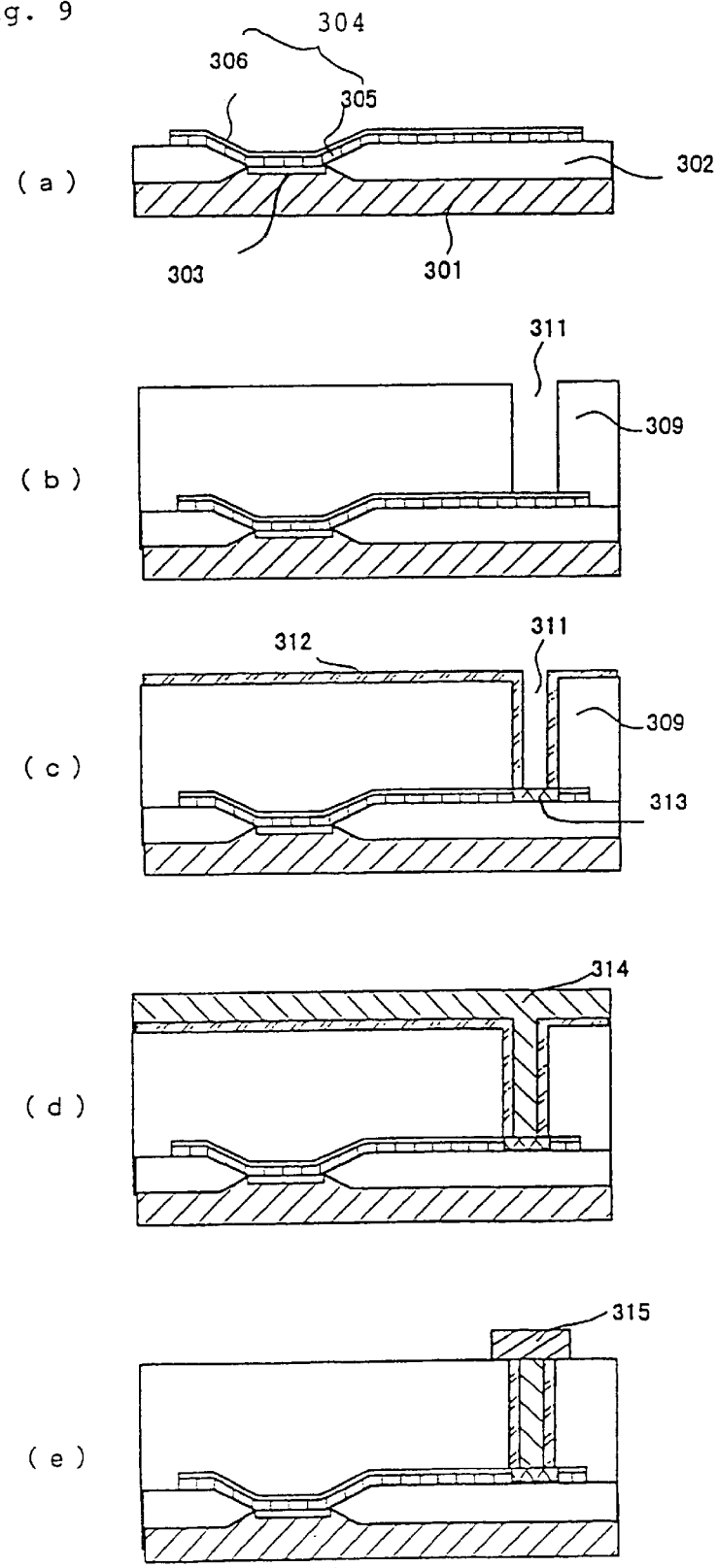
FIG. 9 is a process cross-section showing a process for manufacturing a semiconductor device according to the prior art.
Figure 10:
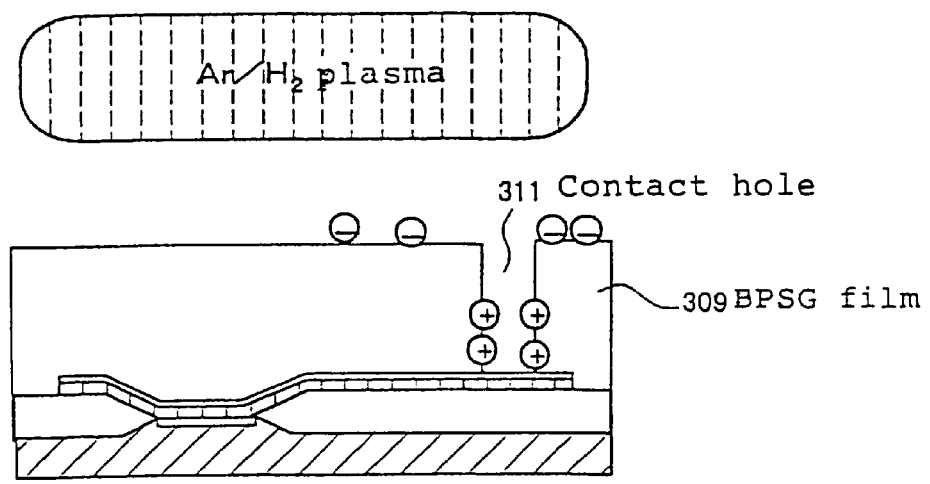
FIG. 10 shows charge accumulation in the manufacturing process of the prior art.

As shown in FIG. 1(a), an MOSFET device comprising a gate oxide film 103 as a gate insulating film, a polycide structure of gate electrode 104 consisting of a polysilicon film 105 and a tungsten-silicide film 106, a sidewall (not shown) on the sidewall of the gate electrode, and a source-drain region was formed on a device region of a p-type silicon substrate 101 which was delimited by a device-separating silicon oxide film 102. The cross-section along the channel indicates a similar structure to that shown in FIG. 8(a) with respect to the prior art. The gate oxide film had a thickness of 50 Å. Various MOSFET structures were fabricated, varying the antenna ratio from 50 to 10000.

As shown in FIG. 1(b), a BSPG film 109 was formed as an interlayer insulating film and then contact holes 111 reaching the source-drain regions (not shown) and the gate electrode 104 were formed. The aspect ratio of the contact hole was about 8 for making this invention very effective.

As shown in FIG. 1(c), a titanium film 112 was formed on the BPSG film surface including the sidewall of the contact hole and on the source-drain region and the gate electrode each exposed in the contact holes, by plasma CVD as described below.

Figure 2:
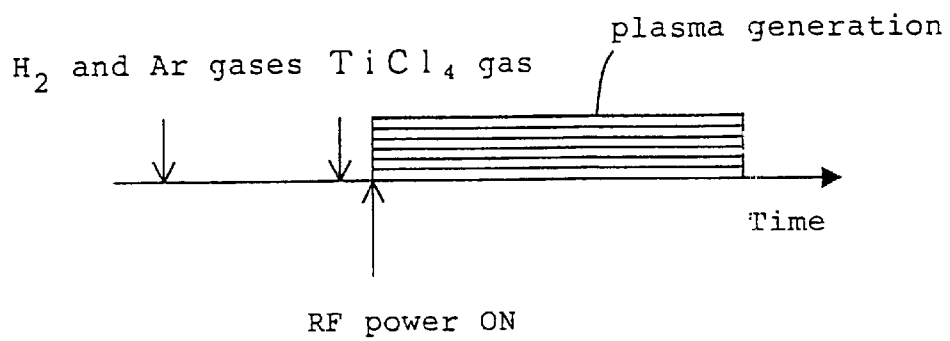
FIG. 2 shows timing for gas introduction and turning RF power on in the manufacturing process of this invention.
Figure 3:
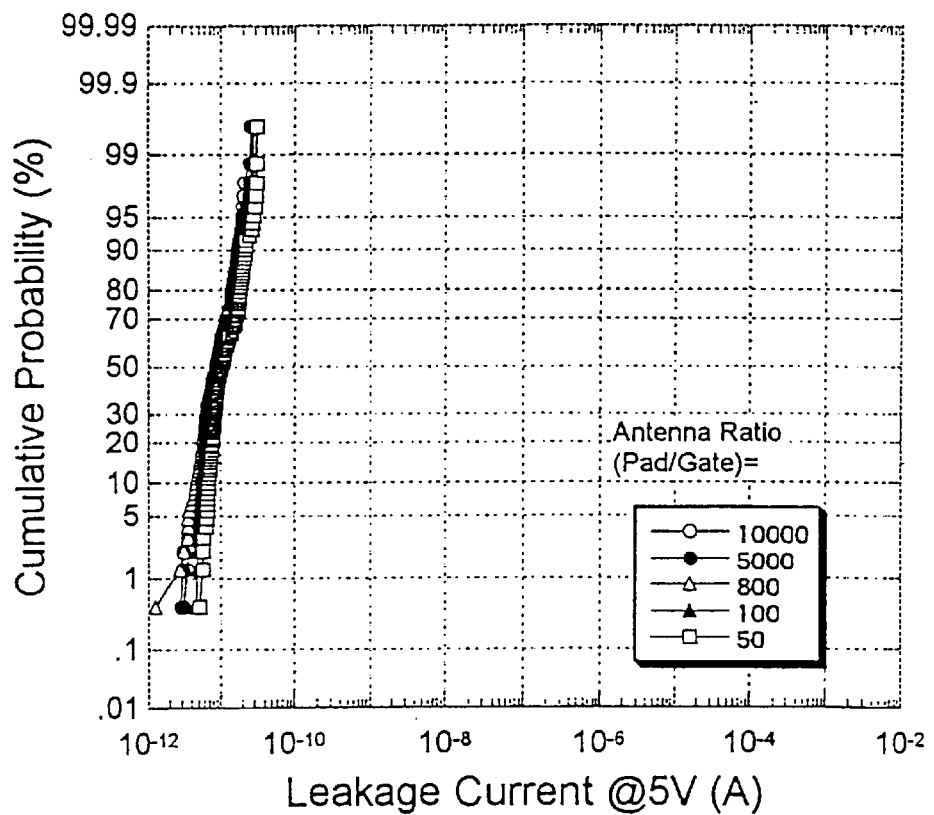
FIG. 3 is a graph showing leakage current properties for MOSFETs prepared by introducing $TiCl_4$ 15 sec. before plasma ignition.
Figure 4:
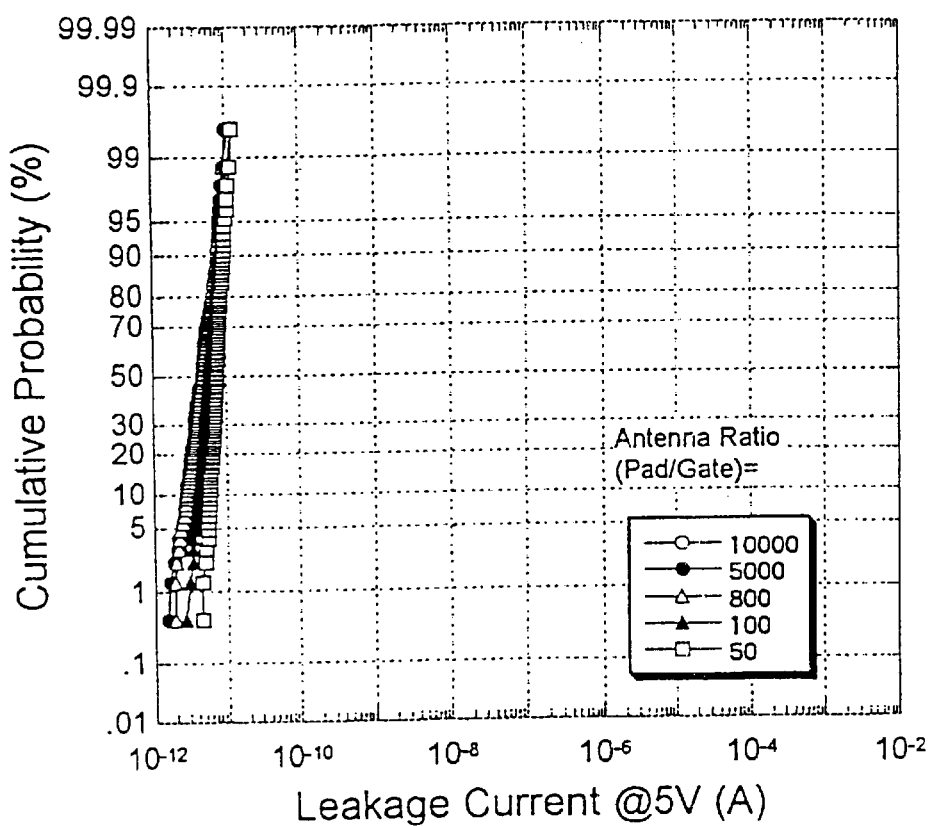
FIG. 4 is a graph showing leakage current properties for MOSFETs prepared by introducing $TiCl_4$ 5 sec. before plasma ignition.
Figure 5:
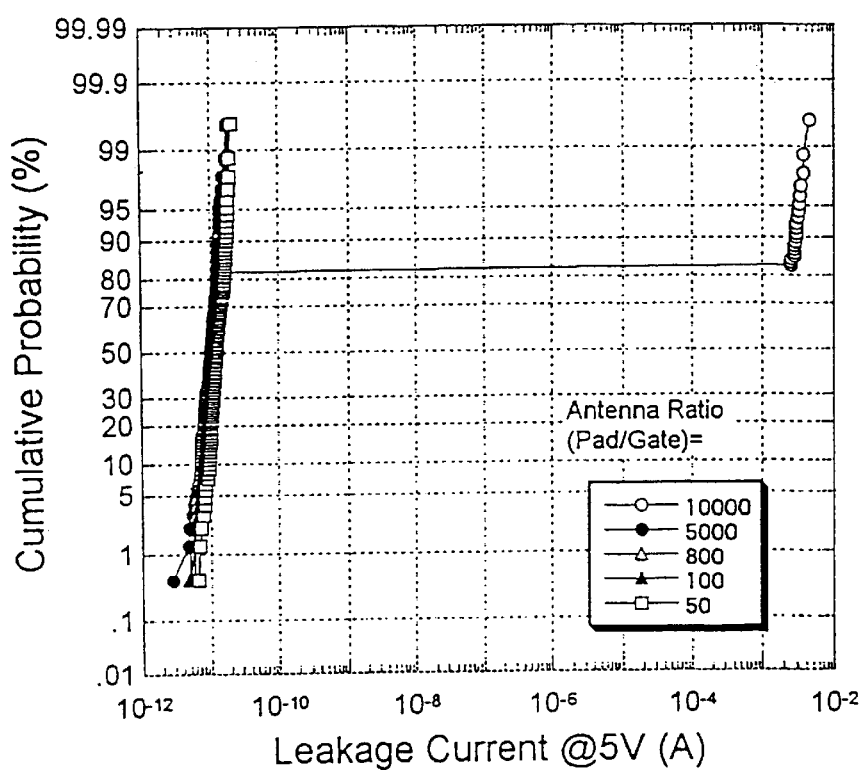
FIG. 5 is a graph showing leakage current properties for MOSFETs prepared by introducing $TiCl_4$ simultaneously with plasma ignition.
Figure 6:
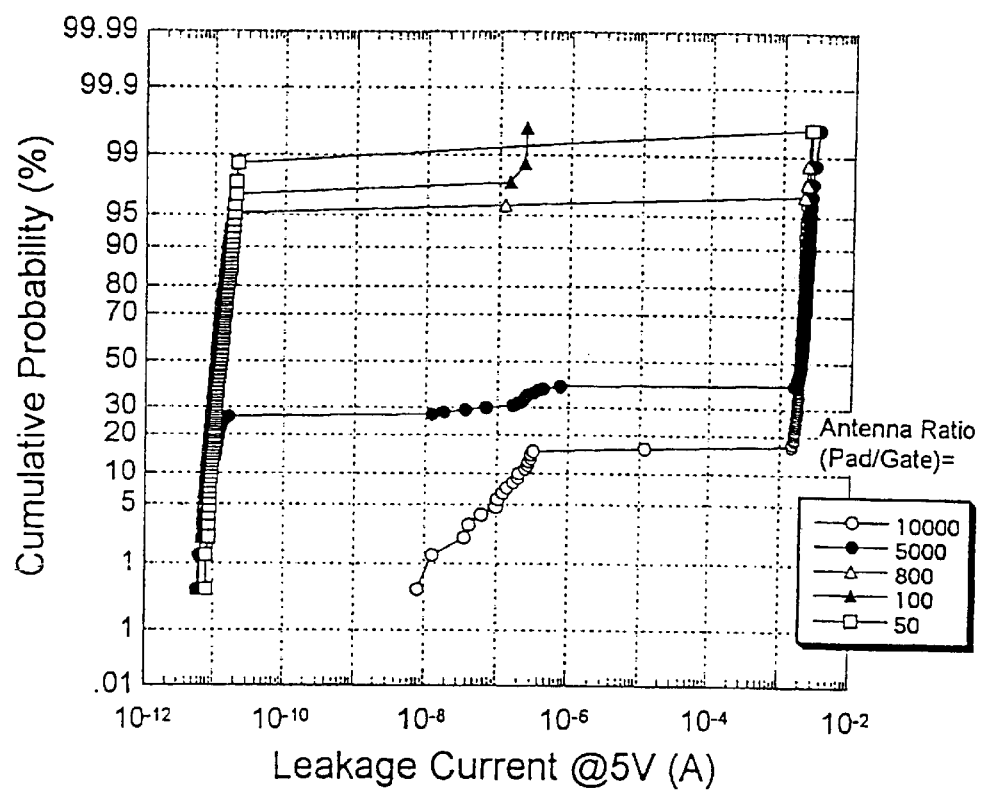
FIG. 6 is a graph showing leakage current properties for MOSFETs prepared by introducing $TiCl_4$ 5 sec. after plasma ignition.
Figure 7:
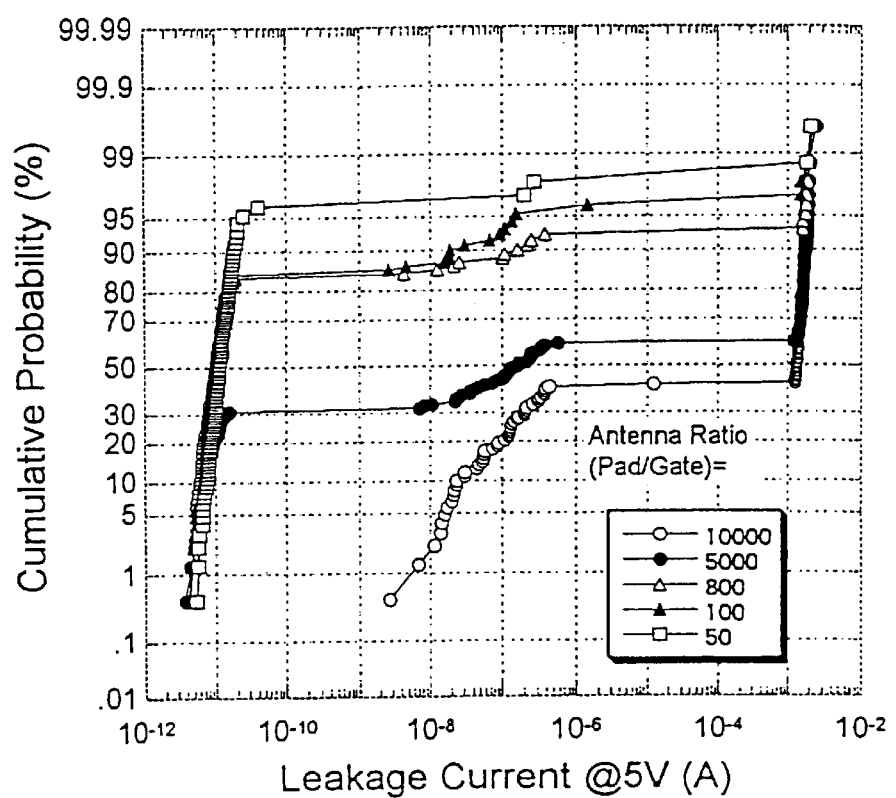
FIG. 7 is a graph showing leakage current properties for MOSFETs prepared by introducing $TiCl_4$ 15 sec. after plasma ignition.

FIG. 2 shows timing in plasma CVD according to this invention. In a chamber of a plasma CVD apparatus were introduced hydrogen and argon gases at 1500 sccm and 500 sccm, respectively. After the total pressure in the chamber reached 5 Torr, introduction of $TiCl_4$ gas was initiated at 3.5 sccm (preferably equal to 1.5 sccm or more) and then RF power was turned ON (RF power 250 W; preferably equal to 500 W or less) to generate plasma. In the process of this invention, $TiCl_4$ gas is introduced simultaneously with or before turning RF power on for plasma generation. Specifically, in the process of this invention, when generating plasma, $TiCl_4$ has been introduced in the chamber of the CVD apparatus, and thus deposition of the titanium metal film is initiated simultaneously with plasma generation. For comparison, after introducing hydrogen and argon gases into the chamber, RF power was turned ON for plasma generation and then $TiCl_4$ was introduced.

A titanium film was deposited to a thickness of 100 Å on the interlayer insulating film. In the process, silicon reacts with titanium on the surfaces of the source-drain region and the gate electrode to form a titanium silicide film 113, which contributes to decrease the contact resistance with the contact plug.

As shown in FIG. 1(*d*), a titanium nitride film 114 was formed by thermal CVD on the whole surface, filling at least the contact holes. The titanium nitride film was etched back to form a plug, leaving the film only in the contact holes 111. An aluminum-alloy film was formed and then patterned by etching to form upper wirings 115 shown in FIG. 1(*e*). The source-drain region and the gate electrode of the MOSFET will be connected to another device or an external terminal via the upper wirings 115.

FIGS. 3 to 7 show properties for MOSFETs fabricated varying timing of $TiCl_4$ introduction according to the above process. As described above, the thickness of the gate oxide film was 50 Å. As the initial withstand-voltage test, a leakage current was determined when a voltage of 5 V was applied between the gate electrode and the silicon substrate for different MOSFETs. In these graphs, the abscissa and the ordinate are a leakage current and a cumulative frequency, respectively. The more damaged the titanium film is by plasma during deposition, the higher a probability for an FET device with a high leakage current becomes.

As seen in the graphs, when $TiCl_4$ was introduced 15 sec. (FIG. 3) or 5 sec. (FIG. 4) before plasma ignition, a leakage current was less than $10^{-10}$ A for any antenna ratio from 50 to 10000. When $TiCl_4$ was introduced simultaneously with plasma ignition (FIG. 5), there were found some devices exhibiting deteriorated properties for an antenna ratio of 10000, while the probability was adequately low for a generally employed range of antenna ratio. In contrast, when $TiCl_4$ was introduced 5 sec. (FIG. 6) or 15 sec. (FIG. 7) after plasma ignition, there were many devices exhibiting deteriorated properties even for an antenna ratio of 50.

As described above, an MOSFET exhibiting good properties without breakdown of a gate oxide film can be provided by introducing $TiCl_4$ into a CVD chamber simultaneously with or before plasma generation as in the process of this invention.

In conclusion, according to this invention, there can be provided a process for manufacturing a semiconductor device where even for a high-density and highly-integrated device, a gate oxide film is not damaged during forming a metal film in a contact hole by plasma CVD, and a plasma CVD apparatus used therefor.

What is claimed is:

1. A process for manufacturing a semiconductor device comprising the step of forming a metal film by plasma CVD in a contact hole which penetrates an interlayer insulating film covering a given device formed on a semiconductor substrate and which reaches an electrode of the device, the device having a gate oxide film, wherein;

the metal film is formed in the contact hole by introducing a gas comprising hydrogen and argon in a deposition chamber of a plasma CVD apparatus and then introducing a metal halide gas in the deposition chamber simultaneously with or before plasma generation by application of RF power, the gate oxide film not being damaged during forming of the metal film in the contact hole.

2. The process for manufacturing a semiconductor device as claimed in claim 1 where the metal halide gas is introduced before plasma generation.

3. The process for manufacturing a semiconductor device as claimed in claim 1 where the metal film is made of a high melting point metal.

4. The process for manufacturing a semiconductor device as claimed in claim 1 where the metal halide is selected from the group consisting of metal chlorides and iodides.

5. The process for manufacturing a semiconductor device as claimed in claim 1 where the device comprises an MOSFET and the contact hole is for electric connection with the gate electrode of the MOSFET.

6. The process for manufacturing a semiconductor device as claimed in claim 5 where the gate insulating film of the MOSFET has a thickness of 100 Å or less.

7. The process for manufacturing a semiconductor device as claimed in claim 5 where an antenna ratio of the gate electrode (defined by dividing the total area of the gate electrode by the area of the channel region) is equal to 100 or larger.

8. The process for manufacturing a semiconductor device as claimed in claim 5 where the aspect ratio of the contact hole is equal to 6 or larger.

* * * * *